(12) United States Patent
Raeisi et al.

(10) Patent No.: US 10,560,096 B2
(45) Date of Patent: Feb. 11, 2020

(54) METHOD FOR DECREASING ENTROPY IN A QUANTUM SYSTEM

(71) Applicants: Sadegh Raeisi, Tehran (IR); Michele Mosca, Kitchener (CA); Maria Kieferova, St. Leonards (AU)

(72) Inventors: Sadegh Raeisi, Tehran (IR); Michele Mosca, Kitchener (CA); Maria Kieferova, St. Leonards (AU)

( * ) Notice: Subject to any disclaimer, the term of this patent is extended or adjusted under 35 U.S.C. 154(b) by 0 days.

(21) Appl. No.: 16/268,005

(22) Filed: Feb. 5, 2019

(65) Prior Publication Data

US 2019/0245540 A1 Aug. 8, 2019

Related U.S. Application Data

(60) Provisional application No. 62/627,571, filed on Feb. 7, 2018.

(51) Int. Cl.
*G06N 10/00* (2019.01)
*H03K 19/003* (2006.01)

(52) U.S. Cl.
CPC ....... *H03K 19/00369* (2013.01); *G06N 10/00* (2019.01)

(58) Field of Classification Search
CPC .................. H03K 19/00369; G06N 10/00
See application file for complete search history.

(56) References Cited

U.S. PATENT DOCUMENTS

| | | | |
|---|---|---|---|
| 2004/0051528 A1* | 3/2004 | Mor | G01R 33/4608 324/314 |
| 2015/0143817 A1* | 5/2015 | Gervais | H01L 23/34 62/3.1 |

* cited by examiner

*Primary Examiner* — Seokjin Kim

(57) ABSTRACT

A method for decreasing entropy in a system includes iteratively applying a set of electromagnetic (EM) pulses to the system, the set of EM pulses effect swaps between the following pairs of system energy levels: a first system energy level in which the reset system is in a lowest energy level and the target system is in a first target system energy level that is not a lowest energy level, and a corresponding second system energy level in which the reset system is in a highest energy level and the target system is in a second target system energy level that is next lowest in energy after the first target system energy level, and waiting a time period.

16 Claims, 7 Drawing Sheets

$\uparrow\uparrow\uparrow \Rightarrow 000 = |0\rangle$        $\downarrow\uparrow\uparrow \Rightarrow 100 = |4\rangle$ $\uparrow\uparrow\downarrow \Rightarrow 001 = |1\rangle$        $\downarrow\uparrow\downarrow \Rightarrow 101 = |5\rangle$ $\uparrow\downarrow\uparrow \Rightarrow 010 = |2\rangle$        $\downarrow\downarrow\uparrow \Rightarrow 110 = |6\rangle$ $\uparrow\downarrow\downarrow \Rightarrow 011 = |3\rangle$        $\downarrow\downarrow\downarrow \Rightarrow 111 = |7\rangle$

FIG. 4A $P_0 = \rho_0 \rho_0 \rho_0 = \left(\frac{e^\epsilon}{z}\right)^3$        $P_4 = \rho_1 \rho_0 \rho_0 = \left(\frac{e^\epsilon}{z}\right)^2 \left(\frac{e^{-\epsilon}}{z}\right)$ $P_1 = \rho_0 \rho_0 \rho_1 = \left(\frac{e^\epsilon}{z}\right)^2 \left(\frac{e^{-\epsilon}}{z}\right)$        $P_5 = \rho_1 \rho_0 \rho_1 = \left(\frac{e^\epsilon}{z}\right) \left(\frac{e^{-\epsilon}}{z}\right)^2$ $P_2 = \rho_0 \rho_1 \rho_0 = \left(\frac{e^\epsilon}{z}\right)^2 \left(\frac{e^{-\epsilon}}{z}\right)$        $P_6 = \rho_1 \rho_1 \rho_0 = \left(\frac{e^\epsilon}{z}\right) \left(\frac{e^{-\epsilon}}{z}\right)^2$ $P_3 = \rho_0 \rho_1 \rho_1 = \left(\frac{e^\epsilon}{z}\right) \left(\frac{e^{-\epsilon}}{z}\right)^2$        $P_7 = \rho_1 \rho_1 \rho_1 = \left(\frac{e^{-\epsilon}}{z}\right)^3$

FIG. 4B

METHOD FOR DECREASING ENTROPY IN A QUANTUM SYSTEM

FIELD

The present disclosure relates to a method for decreasing entropy in a quantum system.

BACKGROUND

Many quantum effects and quantum technologies rely on fragile quantum fluctuations that can easily be suppressed by thermal fluctuations. It is therefore critical to overcome thermal fluctuations for observing these quantum effects. This is why most quantum technologies and applications require cooling or alternative ways of suppressing thermal fluctuations. Often these techniques require sophisticated apparatuses, e.g. cooling in dilution fridge. There are however algorithmic techniques for cooling which are less demanding from this point of view.

Heat-bath algorithmic cooling (HBAC) is a proposed method for decreasing entropy in a quantum system, resulting in an improvement in the purity of quantum states of the quantum system.

HBAC operates on an ensemble of qubits and effectively cools down and purifies a subset of the qubits in the ensemble. HBAC drives the system out of equilibrium by transferring the entropy from target qubits to the rest of the ensemble, which may be referred to as refrigeration qubits. The target qubits may also be referred to as the "computation qubits" and the refrigerant qubits are referred to as the "reset qubits". HBAC was first introduced for a closed system using compression algorithms. For closed system HBAC, the cooling is limited by the Shannon bound for compression. It was later proposed to use a heat-bath to enhance the cooling beyond the Shannon bound.

The achievable purity utilizing proposed HBAC techniques is physically limited and the limit can be achieved only symptomatically. The most optimal HBAC technique that has been previously proposed is known as the partner pairing algorithm (PPA). The asymptotic state of PPA, which reaches the cooling limit, may be referred to as the optimal asymptotic cooling state (OAS).

Although PPA is the optimal technique for HBAC, in practice it is too complex and is not suitable for experimental purposes. One of the main challenges of PPA is that it requires sorting the diagonal of the density matrix in each iteration. These sort operations depend on the state and, because the state changes through the process, the unitary operation for implementing the sort would change as well. In PPA, the sort operation is not a fixed unitary gate and for each iteration, classical computation is required to find the unitary operator that implements the sort for that specific iteration. Computing the unitary operator must be repeated for every iteration, which is computationally taxing. Also, the experimental control would need to change for each iteration in order to implement the specific unitary operation required.

Therefore, PPA is a time and state-dependent process, which leads to several critical problems for "practical" applications of this technique. Here we use "practical" for an algorithm if its process is not time-dependent and is robust to deviations from the expected state in each iteration, and therefore is more experimentally feasible than algorithms that are, for example, time-dependent.

In theory, all the operations in PPA may be pre-computed. However, in practice, small imperfections change the state of the system and the pre-computed operators cannot not sort the diagonal elements of the perturbed density matrix. In order to account for the imperfections, techniques like quantum state tomography would be required to monitor the state of the system, which is not practical in real world applications because, experimentally, tomography is not perfect and involves some estimation errors. Further, even if monitoring the system were possible, the imperfections may affect the result of the PPA, possibly resulting in heating the target qubits and may even not converge.

The ideal HBAC technique should be robust and practically simple and at the same time, converge to the OAS.

Improvements in decreasing entropy in quantum systems are desirable.

SUMMARY OF THE INVENTION

The present disclosure describes a method for reducing the entropy of a quantum system. The disclosed method is state-independent making it practical in real world applications, and, in contrast to previously proposed techniques such as PPA, is fairly robust to imperfections that affect the state throughout the process.

In an embodiment, the present disclosure provides a method for decreasing entropy in a system comprising a target system having one or more target elements each having a first relaxation time, the target system having a set of target system energy levels, and a reset system having one or more reset elements each having a second relaxation time that is shorter than the first relaxation time, the reset system having a set of reset system energy levels, the system having a set of system energy levels that includes the possible combinations of target system energy levels and the reset system energy levels, the method includes iteratively, for a plurality of iterations: applying a set of electromagnetic (EM) pulses to the system, the set of EM pulses effect swaps between the following pairs of system energy levels: a first system energy level in which the reset system is in a lowest energy level of the set of reset system energy levels and the target system is in a first target system energy level that is not a lowest energy level of the set of target system energy levels, and a corresponding second system energy level in which the reset system is in a highest energy level of the set of reset system energy levels and the target system is in a second target system energy level that is next lowest in energy after the first target system energy level, and waiting a time period that is on the order of the second relaxation time and shorter than the first relaxation time to facilitate at least some of the reset elements of the reset system resetting from the highest energy state.

In an example embodiment, the target system comprises a plurality of target elements.

In an example embodiment, the reset system comprises a plurality of reset elements.

In an example embodiment, the target elements are spins.

In an example embodiment, each target element is a multilevel quantum system.

In an example embodiment, the multilevel quantum system is one of spin 1 particles and nitrogen vacancy (nv) centers.

In an example embodiment, the reset elements are spins.

In an example embodiment, each reset element is a multilevel quantum system.

In an example embodiment, the multilevel quantum system is one of spin 1 particles and nitrogen vacancy (nv) centers.

In an example embodiment, the target elements and the reset elements are spins.

In an example embodiment, the target elements are comprised of a spin species different than the reset elements.

In an example embodiment, one or both of the target elements and the reset elements are qubits.

In an example embodiment, the set of EM pulses are applied to implement a sequence of quantum logic gates in order to effect swaps between the pairs of first quantum system energy levels and corresponding second quantum system energy levels.

In an example embodiment, the quantum logic gates include a shift forward gate, a Toffoli gate, an X gate, and a shift back gate.

In an example embodiment, the second relaxation time is an effective relaxation time that is shorter than an intrinsic relaxation time of the reset elements.

In an example embodiment, each iteration further comprises, during the waiting, manipulating the reset system to reduce the second relaxation time from the intrinsic relaxation time to the effective relaxation time.

In an example embodiment, manipulating the reset system comprises performing one of optical polarization, optical pumping, and dynamic nuclear polarization.

In an example embodiment, at least some of the pairs of first system energy levels and the corresponding second system energy levels correspond to one of entangled system states or non-diagonal system states.

BRIEF DESCRIPTION OF THE DRAWINGS

Embodiments of the present disclosure will now be described, by way of example only, with reference to the attached Figures.

FIG. 4A is a schematic diagram showing the energy levels of an example system having three elements;

FIG. 4B is a schematic diagram showing the probabilities for each system state of the example system shown FIG. 4A;

DETAILED DESCRIPTION

Figure 1:
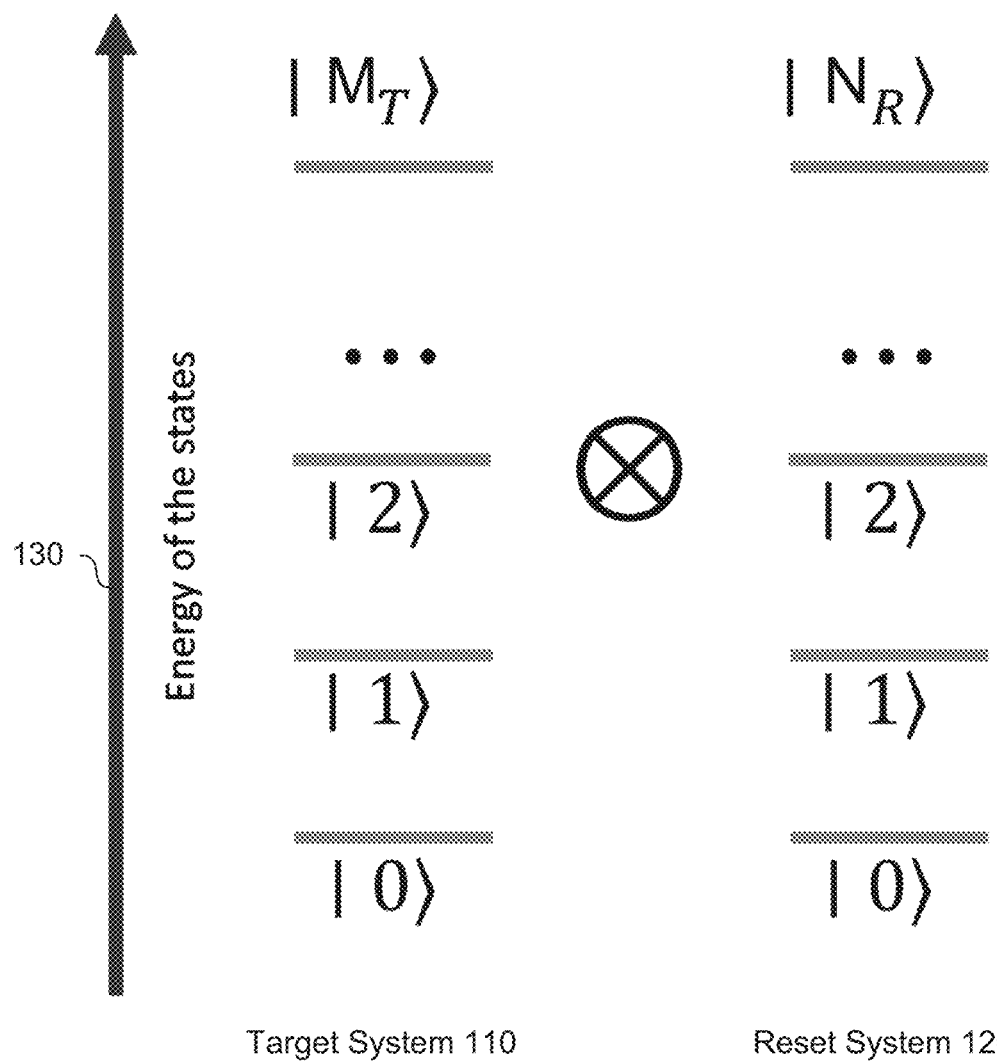
FIG. 1 is a schematic diagram illustrating the energy levels of the target system and the reset system.

The present disclosure describes a method for reducing the entropy of a quantum system. The disclosed method is state-independent, making it practical in real world applications, and, in contrast to previously proposed techniques such as PPA, the asymptotic state of the presently disclosed method is not affected by the imperfections that influence the state in the system in the middle of the process.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

"Quantum system", which may be also referred herein simply as "system", as used in this disclosure means a physical system having discrete energy levels, referred to as the system energy levels. Quantum systems include systems that may be considered classical systems or quasi-classical systems, such as for example nuclear magnetic resonance samples.

The system includes a target system and a reset system. The target system includes one or more targets elements and the reset system includes one or more reset elements, wherein the reset elements have a relaxation time that is shorter than the relaxation time of the target elements. Usually, the reset elements may have a relaxation time that is an order of magnitude shorter than the relaxation time of the target elements. However, in some applications the relaxation time of the reset elements may be, for example, a third or some other fraction of the relaxation time of the target elements, which is determined based on the implementation setting and the desired final precision. The target elements and the reset elements may be any of, for example, spin ½ particles, or a multilevel quantum system. Multilevel quantum systems include elements that have more than two state or energy levels. Multilevel quantum systems may include, for example, spin 1 particles, and nitrogen vacancy (nv) centers.

The target system has a number of target system energy levels and the reset system includes a number of reset system energy levels. For example, when the target elements and reset elements comprise non-zero spin particles, placing the system in a magnetic field will cause the different states of the target system and the reset system to split into target system energy levels and reset system energy levels, respectively. Each state of the system has an associated system energy level. Similarly each target system state and reset system state has, respectively, an associated target system energy level and an associated reset system energy level. In this disclosure, "state" and "energy level" may be used interchangeably.

Referring to FIG. 1, a schematic diagram illustrating the various energy levels of the target system 110 and the reset system 120 is shown. The arrow 130 represents increasing energy such that the energy states shown closer to the bottom of FIG. 1 are lower in energy than the energy states shown above. The notation utilized in FIG. 1 labels the ground state, or lowest energy state, $|0>$, followed by $|1>$ for the next highest energy state, all the way up to $|M_T>$ for the highest energy state of target system and $|N_R>$ for the highest energy state of the reset system. The combination of all possible target system energy levels and reset system energy levels gives all possible system energy levels for the overall system.

In contrast to previously proposed heat-bath algorithmic cooling (HBAC) techniques which are state-dependent, disclosed herein is a method that decreases entropy in the system by iteratively performing a pre-determined set of permutation operations on pairs of the system energy states. The set of permutation operations may be performed in the system by applying a set of electromagnetic (EM) pulses to the system. As set out below, it is shown that the entropy converges to the asymptotic limit, referred to previously, if swap operations are performed between pairs that comprise a first system energy level in which the reset system is in a lowest energy level of the set of reset system energy levels and the target system is in a first target system energy level that is not a lowest energy level of the set of target system energy levels, and a corresponding second quantum system energy level in which the reset system is in a highest energy level of the set of reset system energy levels and the target system is in a second target system energy level that is next lowest in energy after the first target system energy level.

By predetermining all of the possible pairs of such first system energy levels and corresponding second system energy levels, a set of permutation operations may be determined. The EM pulses that effect such permutation operations may be determined based on the difference in energy between the system energy levels of each pair, which may be determined by, for example, spectroscopy performed on the system. For example, each permutation operation may have a corresponding EM pulse that has a frequency corresponding to the difference in energy of the energy levels swapped by the permutation operation. In the case in which multiple pairs of energy levels have the same energy difference, one EM pulse may effect the swap operations for those multiple pairs. In other examples, each permutation operation may be associated with more than one EM pulse such that the permutation operation is performed via one or more intermediary states of the system energy levels, with the end result being that the desired swap operation is performed between the desired pair of system energy levels. The EM pulses that are applied may be π-pulses.

The number of times, or iterations, that the set of EM pulses are applied in order to reach convergence may be determined by, for example, the desired accuracy and precision of the operations. The number of iterations may be predetermined number of iterations which relates to the number of iterations that are predicted for the system to reach a desired fidelity or for the system to vary from the ideal state by an amount that is less than or equal to a predetermined amount. Alternatively, or additionally, the system may be monitored such that the set of EM pulses are applied until the system is determined to have reached the desired fidelity or to vary from the ideal state by an amount less than or equal to a predetermined amount. The ideal state may be the OAS.

The full set of permutation operations, including multiple iterations, may be described by a time-homogeneous Markov process. In the following description, the transfer matrix of the process is found and the spectrum of the transfer matrix is calculated. The spectrum is then utilized to show that applying the transfer matrix to the system converges to the optimal asymptotic cooling state (OAS) and to provide an upper-bound for the number of iterations that results in convergence.

The following description of the disclosed technique utilizes the typical framework of HBAC techniques in which the system comprises an ensemble of n+1 qubits, in which the last qubit forms the reset system, i.e., is the reset qubit, and the remaining n qubits form the target system, which may also be referred to as computation qubits.

In the cooling process, in each iteration, the reset qubit heats up beyond the heat-bath temperature, the heat bath being the environment that surrounds the system. Then the interaction with the heat-bath, which is referred to as the "reset step", cools down the reset qubit to the bath temperature. In the following discussion, it is also assumed that the states of the computation qubits do not change through the reset step due to the relaxation time being much longer than the relaxation time of the reset qubit.

Mathematically the reset step may be described as $R[\rho]=Tr_R(\rho)\otimes\rho_R$, where $Tr_R$ is the partial trace over the reset qubit and p is the density matrix of the system, which describes the state of the system and $\rho_R$ is the density matrix of the reset system and may be given by:

$$\rho_R = \frac{1}{z}\begin{pmatrix} e^\epsilon & 0 \\ 0 & e^{-\epsilon} \end{pmatrix} \qquad \text{(Eq. 1)}$$

with $z=(e^\epsilon+e^{-\epsilon})$. The parameter $\in$ is called the polarization and $$\epsilon = \frac{\delta}{2K_b T_B}$$

with δ the energy gap between the states of the reset qubit, $K_b$ the Boltzmann constant, and $T_B$ the bath temperature. The subscript R refers to the reset qubit and C to refer to the computation qubits.

The entropy transfer is given by a multi-qubit unitary operation that acts on the computation and the reset qubits. Different HBAC techniques utilize different multi-qubit unitary operations.

For example, PPA sorts the elements on the diagonal of the density matrix decreasingly. This is known to be the optimal technique. It is assumed that the Hilbert space is structured as $H_C^{\otimes n}\otimes H_R$, i.e., the first part are the computation qubits and the last part is the reset qubit.

In technique described in the present disclosure, instead of sorting the diagonal elements, we apply the following unitary in each iteration:

$$U_{TS} = \begin{pmatrix} 1 & 0 & 0 & 0 & 0 & \cdots & 0 & 0 & 0 \\ 0 & 0 & 1 & 0 & 0 & \cdots & 0 & 0 & 0 \\ 0 & 1 & 0 & 0 & 0 & \cdots & 0 & 0 & 0 \\ 0 & 0 & 0 & 0 & 1 & \cdots & 0 & 0 & 0 \\ 0 & 0 & 0 & 1 & 0 & \cdots & 0 & 0 & 0 \\ \vdots & \vdots & \vdots & \vdots & \vdots & \ddots & \vdots & \vdots & \vdots \\ 0 & 0 & 0 & 0 & 0 & \cdots & 0 & 1 & 0 \\ 0 & 0 & 0 & 0 & 0 & \cdots & 1 & 0 & 0 \\ 0 & 0 & 0 & 0 & 0 & \cdots & 0 & 0 & 1 \end{pmatrix}.$$

The matrix $U_{TS}$ is $2^{n+1}\times 2^{n+1}$ and acts on both the computation and the reset qubits. The unitary $U_{TS}$ swaps every two neighboring elements on the diagonal of the density matrix, except for the first and the last elements. The two neighboring elements that are swapped correspond to the pairs of system energy levels described above.

Intuitively, this unitary $U_{TS}$ is a partial sort that acts locally on the density matrix. Mathematically each iteration applies the following channel on the full density matrix $C[\rho]=U_{TS}^\dagger(Tr_R(\rho)\lfloor\rho_R)U_{TS}$.

This process is independent of the iteration or the state, resulting in a time-homogeneous Markov process. The sequence of the elements on the diagonal of the density matrix form a Markov chain. $\{\lambda^t\}$ represents the tth link of the chain. Each link is a vector with $2^{n+1}$ elements. A similar notation is used for the density matrix of the computation qubits (without the reset qubit) in which $\{p^t\}$ represents the state of the computation qubits after the tth iteration.

Figure 2:
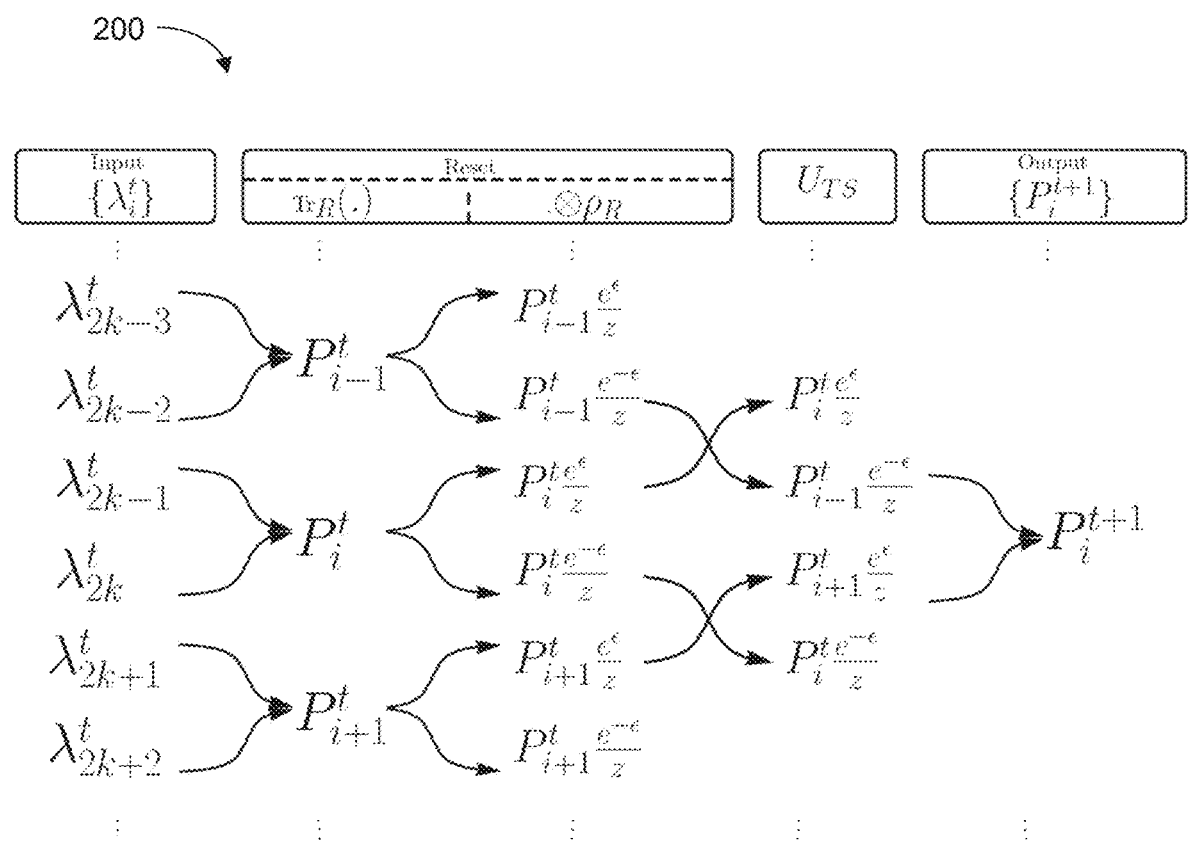
FIG. 2 is a schematic diagram illustrating a process for decreasing entropy in a system for one iteration according to an embodiment.

Referring to FIG. 2, a schematic diagram illustrating the process 200 that occurs during in each iteration is shown. The process 200 begins with the sequence $\{\lambda^t\}$ which are the diagonal elements of the density matrix of the n computation and one reset qubits in the $t^{th}$ iteration. First there is a reset step which takes the reset qubit to the state in Eq. 1. This reset step takes every two neighboring elements $\lambda_{2k+1}^t$ and $\lambda_{2k+2}^t$ to $p_k^t = \lambda_{2k+1}^t + \lambda_{2k+2}^t$ and then splits them into $\zeta_{2k+1}^t = p_k^t e^{\epsilon}/z$ and $\zeta_{2k+2}^t = p_k^t e^{-\epsilon}/z$. Now the two-sort unitary is applied and rearranges the array to $\{\lambda^{t+1}\}$ such that $\lambda_{2k}^{t+1} = \zeta_{2k+1}^t$ and $\lambda_{2k+1}^{t+1} = \zeta_{2k}^t$.

For simplicity, focus may be placed on the computation qubits and the reset qubit may be traced out, meaning that the total probability for that system qubit state is computed by summing over all the possible corresponding reset qubit states. The result of tracing out the reset qubit is the following update rule for the diagonal elements of the computation qubits:

$$p_i^{t+1} = p_{i-1}^t \frac{e^{-\epsilon}}{z} + p_{i+1}^t \frac{e^{\epsilon}}{z} \qquad \text{(Eq. 2)}$$

for $1 < i < 2^n$.

Similarly for the first and the last element, the update rules are $$p_1^{t+1} = (p_1^t + p_2^t)\frac{e^{\epsilon}}{z} \text{ and } p_{2^n}^{t+1} = (p_{2^n-1}^t + p_{2^n}^t)\frac{e^{-\epsilon}}{z}.$$

These update rules give the following transition matrix for the Markov process:

$$T = \frac{1}{z}\begin{pmatrix} e^{\epsilon} & e^{\epsilon} & 0 & \cdots & 0 \\ e^{-\epsilon} & 0 & e^{\epsilon} & \cdots & 0 \\ 0 & e^{-\epsilon} & 0 & \cdots & 0 \\ 0 & 0 & \cdots & \ddots & \vdots \\ 0 & 0 & \cdots & e^{-\epsilon} & e^{-\epsilon} \end{pmatrix}.$$

It can be verified that $(\overrightarrow{\{p^{t+1}\}}) = T.(\overrightarrow{\{p^t\}})$ gives the update rules above. The spectrum of the transfer matrix may be utilized to show that the Markov chain converges to the OAS. T has a unique eigenvalue 1 and the remaining eigenvalues are $$\lambda_k = \frac{2\cos\frac{k\pi}{2^n}}{z} \text{ for } k = 1, 2 \ldots 2^n - 1.$$

The eigenstate corresponding to eigenvalue one is:

$$\rho = p_0\{1, e^{-2\epsilon}, e^{-4\epsilon}, \ldots\},$$

which is equal to the optimal asymptotic state of the previously proposed partner pairing algorithm (PPA). Because all the other eigenvalues lie in the interval (1, −1), the Markov chain asymptotically converges to ρ. The presently described technique asymptotically achieves the cooling limit of HBAC. The details for calculating the eigenvalues are set out in the Appendix at the end of this description.

Thus, in the above described process, iteratively applying same set of permutation operations to the system, following by waiting a time period to allow for the reset elements to reset, results in the system converging to the OAS in a manner that is independent of the state of the system at any iteration.

Figure 3:
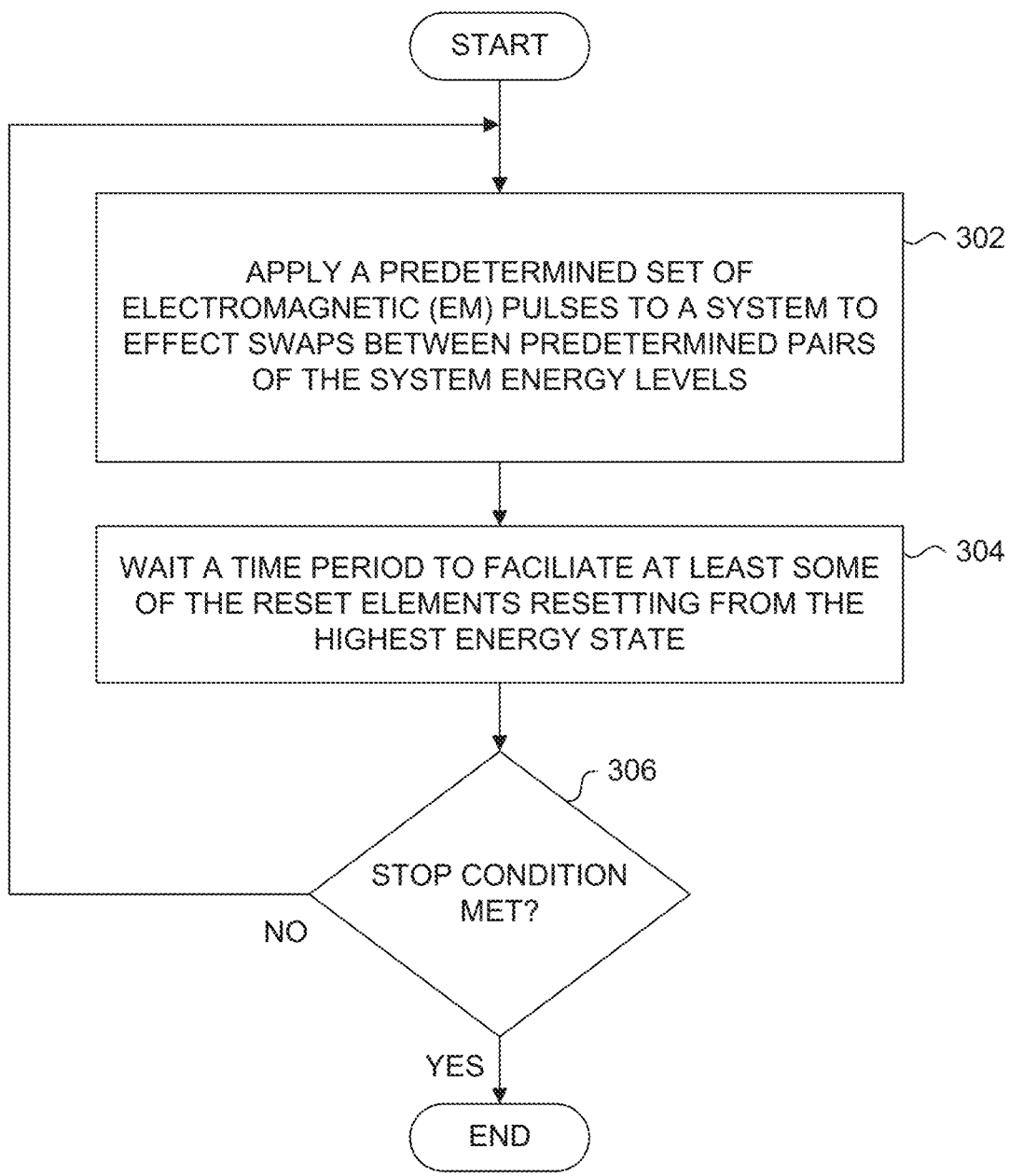
FIG. 3 is a flow chart illustrating a method for decreasing entropy in a system according to an embodiment.

Referring now to FIG. 3, a flow chart illustrating a method for decreasing entropy in a system is shown. The method may be carried out by software executed, for example, a processor. Coding of software for carrying out such a method is within the scope of a person of ordinary skill in the art given the present description. The method may contain additional or fewer processes than shown and/or described, and may be performed in a different order. Computer-readable code executable by at least one processor of an electronic device to perform the method may be stored in a computer-readable storage medium, such as a non-transitory computer-readable medium.

At 302, a set of predetermined EM pulses are applied to a system to effect swaps between predetermined pairs of energy levels of the system. As described above, the system includes a target system comprising one or more target elements and a reset system comprising one or more reset elements. The reset elements have a relaxation time that is shorter than the relaxation time of the target elements. The target elements and the reset elements may be any of, for example, spin ½ particles, or a multilevel quantum system which include, for example, electrons, spin 1 particles, and nitrogen vacancy (nv) centers.

The target system has a number of target system energy levels and the reset system includes a number of reset system energy levels. The combination of all possible target system energy levels and reset system energy levels gives all possible system energy levels for the overall system.

The predetermined set of EM pulses effect swap operations between pairs of system energy levels, each pair including a first quantum system energy state in which the reset system is in a lowest reset system energy level, i.e., the reset system is in a ground state, and the target system is in a first target system energy level that is not a lowest target system energy level, i.e., the target system is not in the ground state, and a corresponding second quantum system energy level in which the reset system is in a highest reset system energy level and the target system is in a second target system energy level that is next lowest in energy after the first target system energy level.

As discussed previously, the frequencies of the EM pulses that effect such swap operations may be determined based on the difference in energy between the system energy levels between the states corresponding to the swap. The difference in energy associate with each pair of system energy level may be determined by, for example, spectroscopy measurements performed on the system. Each swap operation may be associated with one EM pulse of the set of pulses, or may be associated with multiple EM pulses. For example, multiple EM pulses may be applied such a swap operation is effected via intermediary system energy levels. Further, because the EM pulses are determined based on an energy difference between the states corresponding to the swap, it is possible that a single EM pulse may be associated with multiple pairs of system energy levels if the multiple pairs of system energy levels are separated by the same energy difference. The EM pulses may be π-pulses.

The set of EM pulses applied at 302 may be applied simultaneously, or may be applied sequentially, or a portion may be applied simultaneously while another portion is applied sequentially.

After the predetermined set of EM pulses are applied at 302, a time period is waited at 304 to facilitate at least some of the reset elements resetting from highest reset system energy level to a lower reset system energy level. The time period that is waited may be on the order of the relaxation time of the reset system, which is much shorter than the relaxation period of the target system. In this way, the reset elements reset between iterations of applying the set of EM pulses while the target elements do not have time to reset in a significant amount.

In some embodiments, the relaxation time of the reset system may be an effective relaxation time that is shorter than an intrinsic relaxation time of the reset system. The effective relaxation time may be the result of manipulating the reset system to reduce the relaxation time from the intrinsic relaxation time to the effective relaxation time. For example, manipulating the reset system may include performing, for example, optical polarization, optical pumping, or dynamic nuclear polarization during the time period waited at 304.

Although the above-described example method, and the flow chart shown in FIG. 3 includes applying the set of EM pulses at 302 first, followed by waiting the time period at 304, in other embodiments, each iteration may include waiting the time period first, followed by applying the EM pulses.

At 306, a determination of whether a stop condition has been met is made. The stop condition may be, for example, a predetermined number of iterations. In another example, the stop condition may be the system reaching a particular state. For example reaching a state in close vicinity of the OAS or after a certain amount of time. The vicinity may be determined by the precision and quality of the EM pulses and other factors that may affect the fidelity of the states.

If the stop condition is determined not to be met at 306, the process returns to 302 and the predetermined set of EM pulses is applied again, followed by waiting a time period at 304. If the stop condition is determined to be met at 306, then the process ends.

In some cases, such as when the density matrix of the system does not include off diagonal elements, the density matrix may be simplified to a probability vector that gives the probability that the system is in a particular state. For example, a system comprising n spin-½ elements will have $2^n$ possible states, and the probability vector may be written as $\{P_0, P_1, P_2, P_3, P_4, \ldots P_{2^n-1}\}$, where each $P_j$ represents the probability of having specific state $|j\rangle$. In this example, we assume that at least the first element is a target element, and the $n^{th}$ element is the reset element, then the permutation operations that are implemented by the EM pulses change the probability vector as follows:

$$\{P_0, P_1, P_2, P_3, P_4, \ldots P_{2^n-1}\} = \{P_0, P_2, P_1, P_4, P_3, \ldots P_{2^n-1}\}$$ (Eq. 3)

Figure 4C:
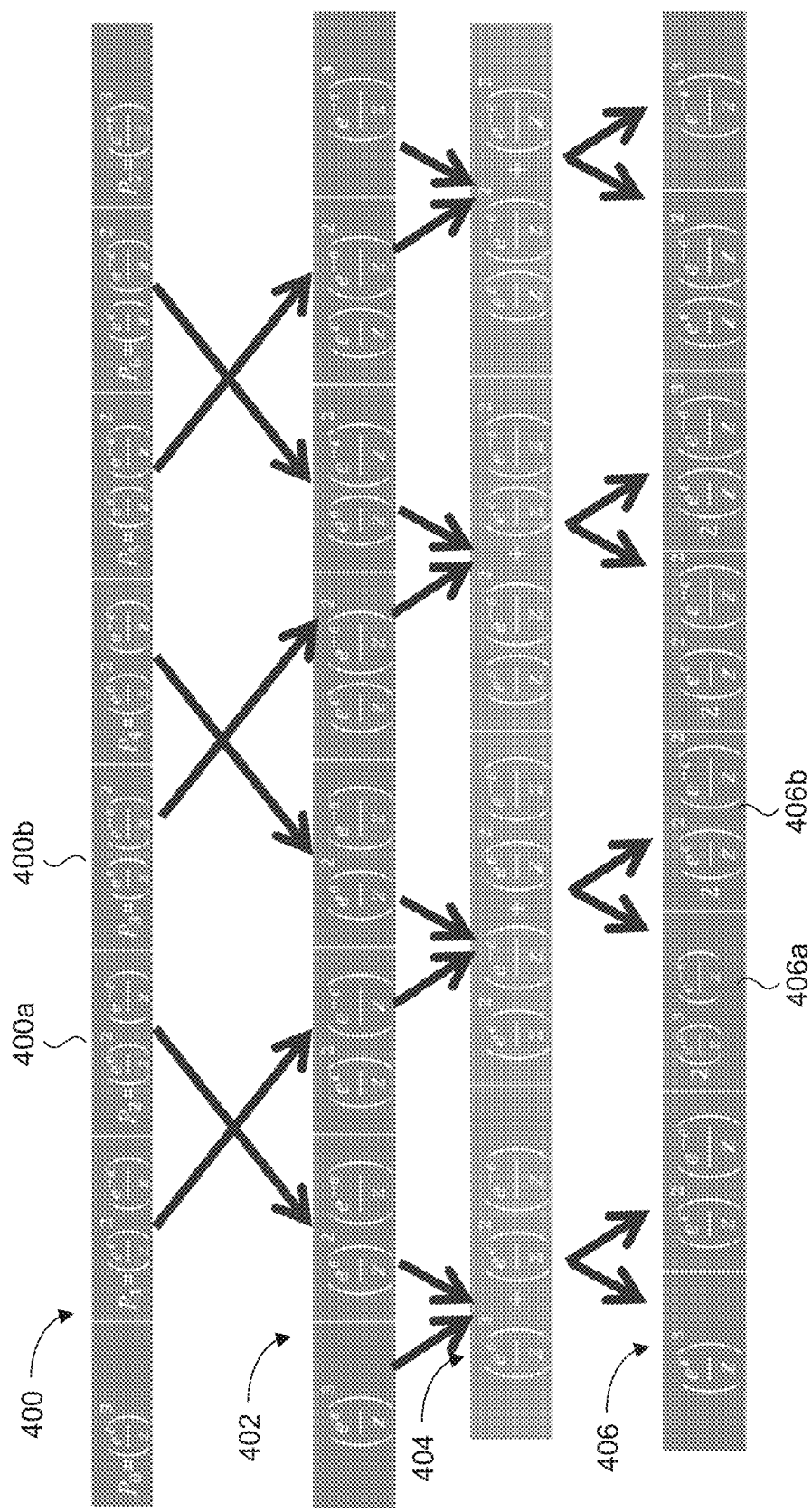
FIG. 4C is a schematic diagram illustrating the method for decreasing entropy according to the embodiment shown in FIG. 3 for the example system shown in FIG. 4A.

With reference to FIGS. 4A through 4C, an example of an iteration for n=3 system comprising all of the eight possible states of the system are shown in FIG. 4A. In the example shown in FIG. 4A, the two left-most spins are target spins and form the target system, and the right-most spin is the reset spin and forms the reset system.

If we assume that the state of each spin is determined by a Boltzmann distribution, then the probability of a particular spin element being in a particular state is given by the probability vector $$\left\{\rho_0 = \frac{e^\epsilon}{z}, \rho_1 = \frac{e^{-\epsilon}}{z}\right\},$$

where $\epsilon$ depends on the spins, temperature, etc. and z is a normalization factor, $\rho_0$ is the probability of finding a particular spin in a spin up state, i.e., aligned with an external magnetic field and denoted by ↑ in FIG. 4A, and $\rho_1$ is the probability of finding the particular spin in a spin down state, i.e., aligned opposite to an external magnetic field and denoted by ↓ in FIG. 4A. Because the spin up state, i.e., aligned with an external magnetic field, is the lower energy state, "cooling" the target system is achieved by increasing the probability for system states in which the target spins are spin up.

Utilizing the probabilities that a particular element is in the spin up or spin down state, the probabilities of each of the possible states of the system is determined by multiplying the probabilities of each element, resulting in the probability vector shown in FIG. 4B.

In this example, the pairs of energy states that will be swapped, according to the description set out above, are $|2\rangle \leftrightarrow |1\rangle$, $|6\rangle \leftrightarrow |5\rangle$, and $|4\rangle \leftrightarrow |3\rangle$. As can be seen in FIG. 4A, each of the pairs of system states includes a first state, i.e., one of $|1\rangle$, $|3\rangle$, and $|5\rangle$, in which the reset system is in a highest energy level, i.e., the reset spin is spin down, and the target system is in a state that is not the highest energy level, i.e., at least one of the target spins is spin up, and a corresponding second state, i.e., one of $|2\rangle$, $|4\rangle$, and $|6\rangle$, in which the reset system is in the lowest energy level, i.e., the reset spin is spin up, and the target system is in a next highest energy level, i.e., one of the target spins that is spin up in the first state is spin down in the second state.

The set of three EM π-pulses that effect the three desired permutation operations are EM π-pulses having frequencies determined by the energy difference between the three pairs of system states given above, namely $$f1 = \frac{E_2 - E_1}{2\pi}, f2 = \frac{E_6 - E_5}{2\pi}, \text{ and } f = \frac{E_4 - E_3}{2\pi},$$

where $E_i$ is the energy level of the $i^{th}$ state of the system.

FIG. 4C shows a schematic diagram illustrating how the probability vector changes throughout an iteration of applying the set of EM pulses and waiting a time period for the reset element to reset. Probability vector 400 shows the probability of the system being in each state prior to applying the set of EM pulses, which is the same as the probability vector shown in FIG. 4B. Probability vector 402 shows the probability of the system being in each state after the set of EM pulses is applied, and the pairs of states of the system are swapped. As can be seen in the example shown in FIG. 4B, the permutation effected by the set of EM pulses sorts the probability vector 402 from largest probability, in the $|0\rangle$ or coolest state, to the smallest probability in the $|7\rangle$ or hottest state. However, in general, the EM pulses may not fully sort the probability vector. Also note the probability of the first target spin, which is the left-most spin shown in FIG. 4A, being in a spin up state, i.e., states $|0\rangle$, $|1\rangle$, $|2\rangle$, and $|3\rangle$, has increased slightly compared to the initial probability vector 400.

Probability vector 404 shows the probability of the states during the period in which reset spin, or right-most spin shown in FIG. 4A, is resetting back to its original state. In this case, the eight system states have condensed down to 4 states because we have traced out the reset spin, and can effectively consider the system as a two spin system. After the time period is waited and the reset spin has returned to its original state, we multiply by the original reset spin probabilities to generate the probability vector 406 after the reset elements have reset. As can be seen, the probabilities 406a and 406b that the system is in states |2> and |3>, respectively, are greater than the probabilities 400a and 400b that the system is in states |2> and |3>, respectively prior to interaction. Both |2> and |3> states have the first target spin in the spin up orientation, and therefore the target element of the system has a higher probability of being in the desired lower energy state after the iteration than prior to the iteration.

Figure 5A:
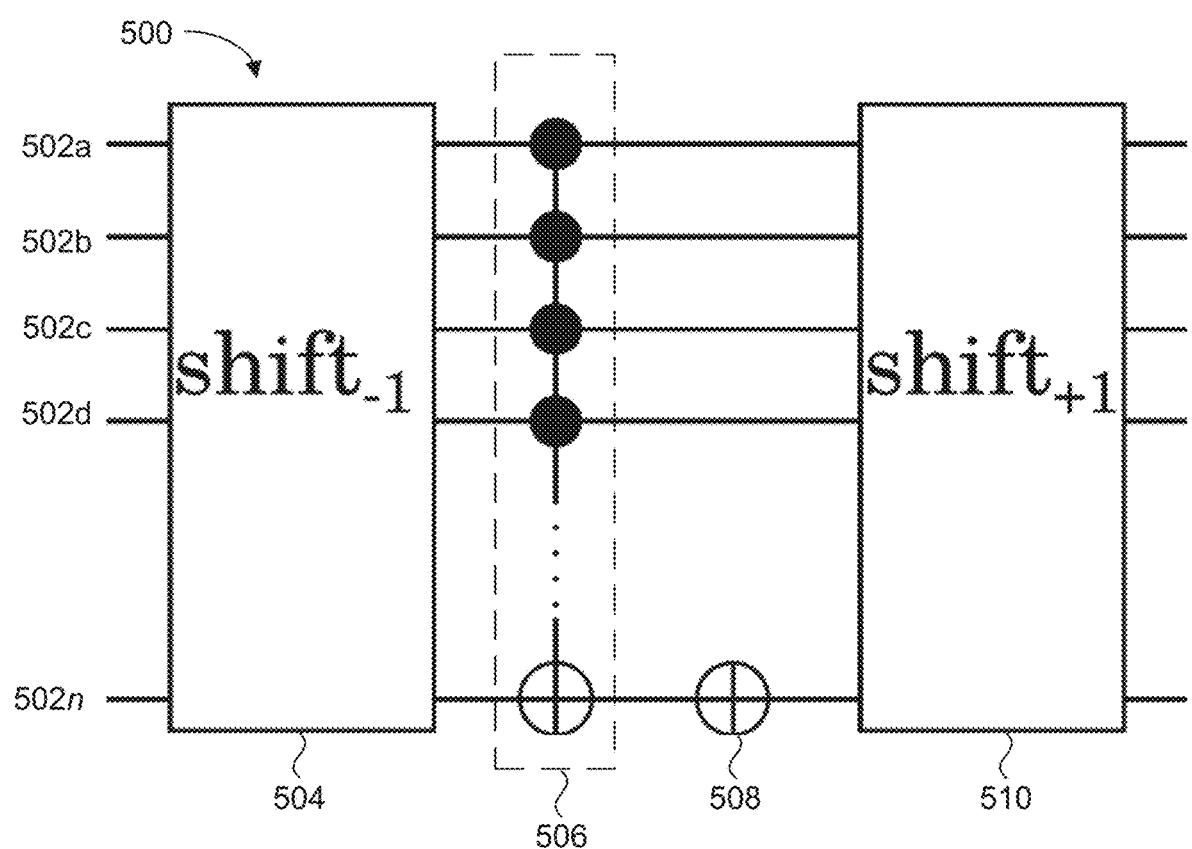
FIG. 5A is a schematic diagram illustrating an example circuit for implementing the method of decreasing entropy according to the embodiment shown in FIG. 3.

In some embodiments, the set of EM pulses applied at 302 are applied to implement a circuit comprising a sequence of quantum logic gates. Referring now to FIG. 5A, a schematic diagram of an example quantum circuit 500 for implementing the desired permutation operations in accordance with the above description is shown. The quantum circuit gives a more efficient implementation of the algorithm in which fewer operations and EM pulses are applied compared to, for example, applying a separate EM pulse for each pair of states to be swapped.

The horizontal lines represent elements of the system. The example shown is an example in which the system comprises n quantum bits, or two level quantum systems, one of which being a reset element, and at least one being the target element. Although the example described includes two level quantum systems, in general circuits that include quantum gates may be utilized for quantum systems having more than two levels or systems having off-diagonal elements in a density matrix of the system. In the circuit 500 shown, lines 502a to 502n-1 represent target elements forming the target system, and line 502n represents the one reset element forming the reset system. The circuit 500 includes a shift forward gate 504, followed by a Toffoli gate 506, followed by an X gate 508, followed by a shift back gate 510.

The shift forward gate 504 in general performs the shift operation $|x_1 x_2 \ldots x_n\rangle$ to $|(x_1 x_2 \ldots x_n+1) \mod 2^n\rangle$. Referring to the probability vector described previously, operation performed by the shift forward gate 504 is $\{P_0, P_1, P_2, P_3, P_4, \ldots P_{2^n-1}\} \Rightarrow \{P_1, P_2, P_3, P_4, P_5, \ldots P_{2^n-1}, P_0\}$. The shift forward gate 504 may be implemented utilizing a quantum Fourier transformation or a sequence of multiple control Toffoli gates and requires $O(n^2)$ operations.

Figure 5B:
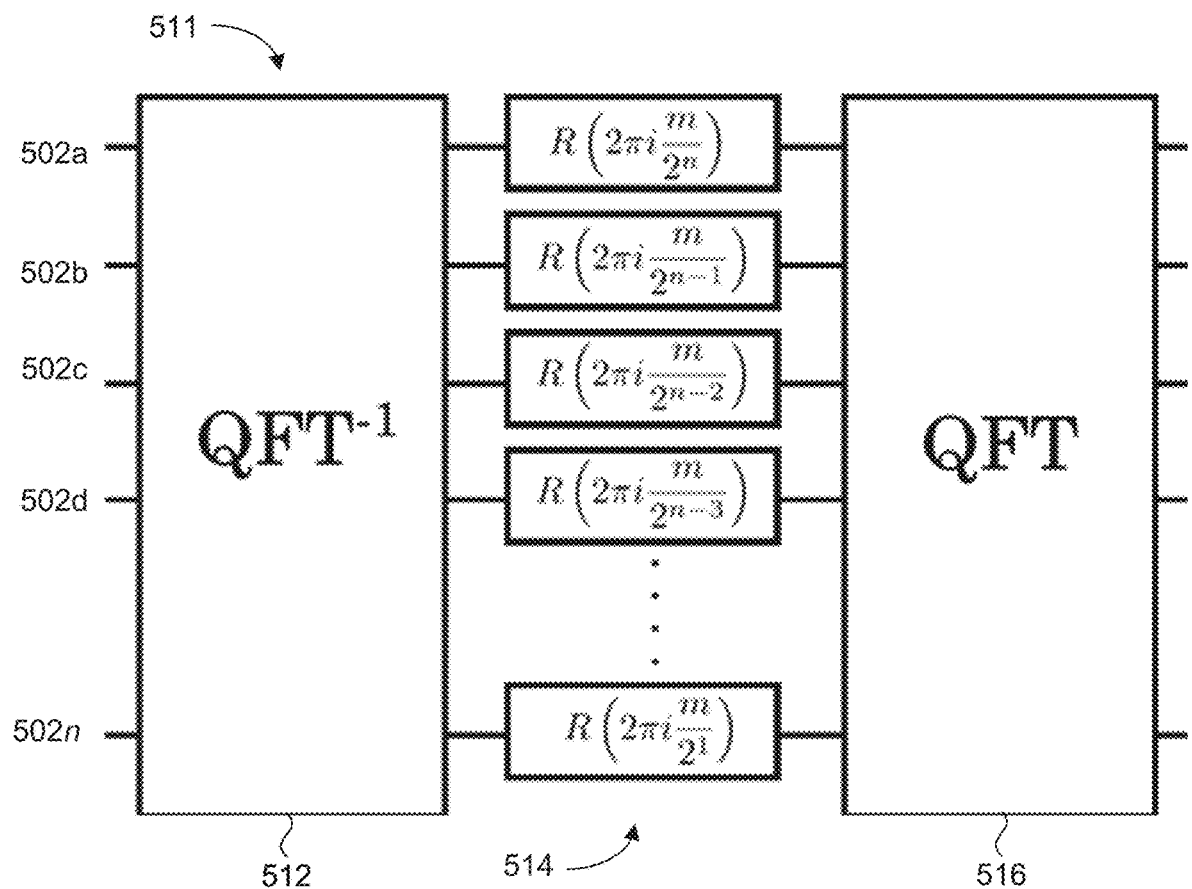
FIG. 5B is a schematic diagram illustrating an example circuit for implementing the shift forward gate in the embodiment shown in FIG. 5A.

An example circuit 511 for implementing the shift forward gate 504 utilizing quantum Fourier transformations is shown in FIG. 5B. The circuit 511 includes an inverse quantum Fourier transformation gate 512, into which the spins of the system are input, represented by lines 502a through 502n, followed by series of a single qubit rotation gates 514 that applies a rotation to the state of the qubit. In this case the single qubit rotation gates 514 correspond to rotations around z axis of the qubit which adds a phase to each state of each single qubit. The single qubit rotation gates 514 are followed by a quantum Fourier transformation gate 516.

Figure 5C:
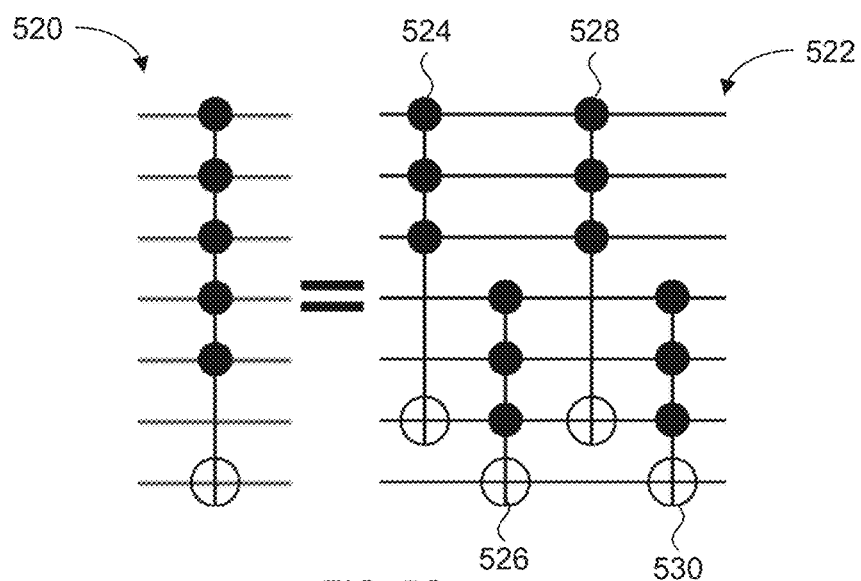
FIG. 5C is a schematic diagrams illustrating an example for decomposing a Tofoli gate into a circuit of smaller CNOT gates.

The Toffoli gate 506 will flip the state of the reset spin, represented by line 502n when all of the other spins, represented by lines 502a to 502n-1 are spin down. The Toffoli gate 506 may be implemented by a circuit having smaller controlled-NOT (CNOT) gates. FIG. 5C shows an example of how an example Toffoli gate 520 may be broken down into a circuit 522 of smaller CNOT gates 524 through 530.

The X gate 508 shown in FIG. 5A couples to the line 502n representing the reset element and flips the reset element. The shift back gate 510 performs the opposite operation that is performed by the shift forward gate. The shift back gate 510 may be implemented utilizing a quantum Fourier transformation or a sequence of multiple control Toffoli gates. For example, the shift back gate 510 may be implemented as the mirror image of the circuit 511 shown in FIG. 5B such that the spins are input into the quantum Fourier transformation gate 516 and are output by the inverse quantum Fourier transformation gate 512, and all rotations performed by the single qubit rotation gates 514 are mirrored as well, i.e., the angle of rotation is the negative of the angle rotated in the circuit 511.

Embodiments of the present disclosure provide a method for reducing entropy in a system having a target system and a reset system in way that is independent from the state of the system. The method utilizes a predetermined set of EM pulses that effect permutation operations between pairs of system states. Each pair of system states includes a first system energy state in which the reset system is in a lowest energy level of the set of reset system energy levels and the target system is in a first target system energy level that is not a lowest energy level of the set of target system energy levels, and a corresponding second system energy level in which the reset system is in a highest energy level of the set of reset system energy levels and the target system is in a second target system energy level that is next lowest in energy after the first target system energy level.

The disclosed method simplifies the process for increasing the alignment of the target elements of the target system, or cooling the target system, by enabling the same set of EM pulses to be applied during each iteration in order to reach convergence at the OAS limit.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

APPENDIX

We solve the eigenvalue equation, $T\Phi^{(p)}=\lambda\Phi^{(p)}$, indexing the eigenvectors by p. Using the sparsity and the structure of T we can rewrite the eigenvalue equations as $$\lambda^{(p)}\Phi_1^{(p)} = (\Phi_1^{(p)} + \Phi_2^{(p)})\frac{e^\epsilon}{z},\qquad\text{[eq. A1 FristT]}$$

$$\lambda^{(p)}\Phi_k^{(p)} = \Phi_{k-1}^{(p)}\frac{e^{-\epsilon}}{z} + \Phi_{k+1}^{(p)}\frac{e^\epsilon}{z},\qquad\text{[eq. A2 Update\_RuleT]}$$

$$\lambda^{(p)}\Phi_{2^n}^{(p)} = (\Phi_{2^n-1}^{(p)} + \Phi_{2^n}^{(p)})\frac{e^{-\epsilon}}{z},\qquad\text{[eq. A3 LastT]}$$

for $1<k<2^n$. We use the ansatz $$\Phi_k^{(p)} = e^{(ip-\epsilon)k} + \alpha e^{(-ip-\epsilon)k}$$

with arbitrary complex parameters $\alpha$ and p. This ansatz automatically satisfies eq. A2 with eigenvalue:

$$\lambda^{(p)} = \frac{2\cos p}{e^\epsilon + e^{-\epsilon}}.$$

We set the value of $\alpha$ by solving eq. A1 and obtain $$\alpha = \frac{e^{ip} - e^{-\Delta}}{e^{-\Delta} - e^{-ip}}.$$

Note that this results forbids p=0 because it gives $\Phi_k^{(0)}=0$.

At last, we satisfy eq. A3 and obtain allowed values of p. The solution $ip=\pm\epsilon$ gives eigenvalue 1 and corresponds to the eigenvector $\Phi_k^{(p)}=e^{-2\Delta k}$.

The remaining eigenvalues are of form $$\frac{2\cos\frac{j\pi}{2^n}}{e^\epsilon + e^{-\epsilon}}$$

for $1\le j<2^n$. All these eigenvalues lie in the range (−1,1). In other words, the Markov chain has a unique eigenvalue one and all the other eigenvalues are smaller than one. Therefore the Markov chain defined by the transition matrix T converges to the +1 eigenvector, which is OAS.

The convergence rate is determined by the difference between 1 and the second largest eigenvalue, $$\lambda^{(2)} = \frac{2\cos\frac{\pi}{2^n}}{e^\epsilon + e^{-\epsilon}}.$$

We can bound the gap as $$\Delta = 1 - (2\cos\frac{\pi}{2^n})/(e^\epsilon + e^{-\epsilon}) \ge \frac{z-2}{z}.$$

The mixing time is then upper-bounded by $$t_{mix}(e) \le \log\left(\frac{1}{el}\right)\frac{1}{\Delta} \le \left(\log\left(\frac{1}{el}\right)\left(\frac{z}{z-2}\right)\right) \le c_1\log\left(\frac{1}{l}\right) + c2,$$

where $$c_1 = \left(\frac{z}{z-2}\right) \text{ and } c_2 = \left(\frac{z}{z-2}\right)\log\left(\frac{1}{e}\right)$$

are both constant with respect to n. To find the scaling of the upper-bound, we need to calculate the $$\log\left(\frac{1}{l}\right) = \log\left(\frac{1}{p_0 e^{-(2^n-1)\epsilon}}\right) = \log\left(\frac{(1-(e^{-2\epsilon})^{2^n})}{(1-e^{-2\epsilon})e^{-(2^n-1)\epsilon}}\right).$$

To understand the scaling, we take n≫1 which simplifies the bound to $$\log\left(\frac{(1)}{e^{-(2^n-1)\epsilon}} + c_3\right),$$

where $c_3=\log(1-e^{-2\epsilon})$. So the scaling of the upper-bound is $O(2^n)$.

What is claimed is:

1. A method for decreasing entropy in a system comprising a target system having one or more target elements each having a first relaxation time, the target system having a set of target system energy levels, and a reset system having one or more reset elements each having a second relaxation time that is shorter than the first relaxation time, the reset system having a set of reset system energy levels, the system having a set of system energy levels that includes the possible combinations of target system energy levels and the reset system energy levels, the method comprising:
   iteratively, for a plurality of iterations:
      applying a set of electromagnetic (EM) pulses to the system, the set of EM pulses effect swaps between the following pairs of system energy levels:
         a first system energy level in which the reset system is in a lowest energy level of the set of reset system energy levels and the target system is in a first target system energy level that is not a lowest energy level of the set of target system energy levels, and
         a corresponding second system energy level in which the reset system is in a highest energy level of the set of reset system energy levels and the target system is in a second target system energy level that is next lowest in energy after the first target system energy level; and
      waiting a time period that is on the order of the second relaxation time and shorter than the first relaxation time to facilitate at least some of the reset elements of the reset system resetting from the highest energy state.

2. The method of claim 1, wherein the target elements are spins.

3. The method of claim 2, wherein each target element is a multilevel quantum system.

4. The method of claim 3, wherein the multilevel quantum system is one of spin 1 particles and nitrogen vacancy (nv) centers.

5. The method of claim 1, wherein the reset elements are spins.

6. The method of claim 5, wherein each reset element is a multilevel quantum system.

7. The method of claim 6, wherein the multilevel quantum system is one of spin 1 particles and nitrogen vacancy (nv) centers.

8. The method of claim 1, wherein the target elements and the reset elements are spins.

9. The method of claim 8, wherein the target elements are comprised of a spin species different than the reset elements.

10. The method of claim 1, wherein one or both of the target elements and the reset elements are qubits.

11. The method of claim 1, wherein the set of EM pulses are applied to implement a sequence of quantum logic gates in order to effect swaps between the pairs of first quantum system energy levels and corresponding second quantum system energy levels.

12. The method of claim 11, wherein the quantum logic gates include a shift forward gate, a Toffoli gate, an X gate, and a shift back gate.

13. The method of claim 1, wherein the second relaxation time is an effective relaxation time that is shorter than an intrinsic relaxation time of the reset elements.

14. The method of claim 1, wherein each iteration further comprises, during the waiting, manipulating the reset system to reduce the second relaxation time from the intrinsic relaxation time to the effective relaxation time.

15. The method of claim 14, wherein manipulating the reset system comprises performing one of optical polarization, optical pumping, and dynamic nuclear polarization.

16. The method of claim 1, wherein at least some of the pairs of first system energy levels and the corresponding second system energy levels correspond to one of entangled system states or non-diagonal system states.

* * * * *